(12) United States Patent
Tao et al.

(10) Patent No.: US 12,183,843 B1
(45) Date of Patent: Dec. 31, 2024

(54) METHOD FOR MANUFACTURING PHOTOVOLTAIC MODULE AND PHOTOVOLTAIC MODULE

(71) Applicants: JINKO SOLAR (HAINING) CO., LTD., Haining (CN); ZHEJIANG JINKO SOLAR CO., LTD., Haining (CN)

(72) Inventors: Wusong Tao, Haining (CN); Dongdong Sun, Haining (CN); Niannian Qin, Haining (CN); Jingguo Yang, Haining (CN); Luchuang Wang, Haining (CN); Bendong Xu, Haining (CN); Zijie Zhao, Haining (CN)

(73) Assignees: JINKO SOLAR (HAINING) CO., LTD., Haining (CN); ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 18/397,455

(22) Filed: Dec. 27, 2023

(30) Foreign Application Priority Data

Sep. 5, 2023 (CN) .......................... 202311141914.5

(51) Int. Cl.
  H01L 31/05 (2014.01)
  H01L 31/18 (2006.01)
(52) U.S. Cl.
  CPC ...... H01L 31/0516 (2013.01); H01L 31/1876 (2013.01)
(58) Field of Classification Search
  CPC .................. H01L 31/0516; H01L 31/1876
  See application file for complete search history.

(56) References Cited

U.S. PATENT DOCUMENTS

| | | | | |
|---|---|---|---|---|
| 5,951,786 A | * | 9/1999 | Gee ...................... | H01L 31/0512 136/259 |
| 2008/0236655 A1 | * | 10/2008 | Baldwin ............. | H01L 31/0516 228/256 |

(Continued)

FOREIGN PATENT DOCUMENTS

| CN | 215988782 U | 3/2022 |
|---|---|---|
| CN | 115632086 A | 1/2023 |

(Continued)

OTHER PUBLICATIONS

English Translation of an Office Action issued in corresponding JP Application 2023-190661, issued Feb. 6, 2024, 7 pages.

(Continued)

Primary Examiner — Sadie White
(74) Attorney, Agent, or Firm — Burris Law, PLLC

(57) ABSTRACT

A method for manufacturing photovoltaic module includes: providing solar cells and a solder strip; applying insulating adhesive on rear surface of the solar cells; laying the solar cells along a first direction; placing the solder strip on the solar cells so that, along the first direction, one end of the solder strip abuts against a positive busbar of one solar cell, and is bonded to the insulating adhesive, and the other end of the solder strip abuts against a negative busbar of another solar cell adjacent thereto, and is bonded to the insulating adhesive; curing the insulating adhesive by irradiation with an ultraviolet lamp, so that the solar cells form a solar cell string; arranging the solar cell strings along a second direction, and connecting to form a photovoltaic cell pack; providing and laminating front packaging structure, the photovoltaic cell pack, and back packaging structure to form the photovoltaic module.

13 Claims, 10 Drawing Sheets

(56) References Cited

U.S. PATENT DOCUMENTS

| | | | |
|---|---|---|---|
| 2011/0120530 A1* | 5/2011 | Isaka | H01L 31/0516 |
| | | | 136/251 |
| 2011/0192826 A1* | 8/2011 | Von Moltke | H01L 31/0516 |
| | | | 219/121.64 |
| 2012/0097241 A1* | 4/2012 | Tsunemi | H01L 31/02167 |
| | | | 136/256 |
| 2012/0167940 A1* | 7/2012 | Toya | H01L 31/0516 |
| | | | 257/E31.124 |
| 2012/0186629 A1* | 7/2012 | Nowlan | H01L 31/048 |
| | | | 438/66 |
| 2013/0129935 A1* | 5/2013 | Yang | H01L 31/0687 |
| | | | 427/558 |
| 2014/0000682 A1* | 1/2014 | Zhao | H01L 31/0481 |
| | | | 136/251 |
| 2014/0060615 A1 | 3/2014 | Gretler et al. | |
| 2015/0007876 A1* | 1/2015 | Komai | H01L 31/049 |
| | | | 136/256 |
| 2016/0035907 A1 | 2/2016 | Lim et al. | |
| 2017/0222082 A1* | 8/2017 | Lin | H01L 31/022441 |

FOREIGN PATENT DOCUMENTS

| | | |
|---|---|---|
| CN | 218827171 U | 4/2023 |
| CN | 218918904 U | 4/2023 |
| CN | 116247120 A | 6/2023 |
| CN | 116581171 A | 8/2023 |
| JP | 2013214603 A | 10/2013 |
| JP | 2016092421 A | 5/2016 |
| JP | 2017228629 A | 12/2017 |
| JP | 2019083346 A | 5/2019 |
| WO | 2009025147 A1 | 2/2009 |
| WO | 2011115305 A1 | 9/2011 |
| WO | 2022199881 A2 | 9/2022 |

OTHER PUBLICATIONS

Office Action issued in corresponding JP Application 2023-190661, issued Jun. 4, 2024, and an English Translation, 8 pages.
Office Action issued in corresponding EP Application 23219593.3, issued Jun. 12, 2024, 8 pages.

* cited by examiner

METHOD FOR MANUFACTURING PHOTOVOLTAIC MODULE AND PHOTOVOLTAIC MODULE

CROSS-REFERENCE TO RELATED APPLICATION

This application claims priority to and the benefit of Chinese Patent Application No. 202311141914.5, filed on Sep. 5, 2023. The disclosure of the above application is incorporated herein by reference.

FIELD

The present disclosure relates to the field of photovoltaic technologies, and in particular, to a method for manufacturing a photovoltaic module and a photovoltaic module.

BACKGROUND

The statements in this section merely provide background information related to the present disclosure and may not constitute prior art.

Solar energy is an inexhaustible renewable energy source for human beings. A photovoltaic module is a core part in a solar power generation system and is also the most important part in the solar power generation system, whose function is to convert solar energy into electrical energy and send the electrical energy to a storage battery for storage or drive a load into operation. The photovoltaic module generally includes a front packaging structure, a back packaging structure, and a photovoltaic cell pack. The photovoltaic cell pack is formed by a plurality of solar cell strings connected in series or in parallel. Each solar cell string includes a plurality of solar cells arranged at intervals, and two adjacent solar cells are connected through a solder strip.

In the related art, the solder strip is fixedly connected to the solar cell by soldering. For a conventional solar cell, front and back surfaces thereof are required to be provided with a solder strip, which can offset soldering stress. However, for a back contact solar cell, positive and negative electrodes thereof are both located on the back surface, and soldering stress cannot be eliminated, which may lead to warping of the solar cell, thereby increasing the defective rate of the photovoltaic module.

SUMMARY

This section provides a general summary of the disclosure and is not a comprehensive disclosure of its full scope or all of its features.

The present disclosure provides a method for manufacturing a photovoltaic module, and a photovoltaic module, which can reduce the possibility of warping of a back contact solar cell during the arrangement of the solder strip.

In a first aspect of the present disclosure, a method for manufacturing a photovoltaic module is provided, the method includes the following steps: providing a plurality of solar cells and a solder strip, the solar cells are a back contact solar cell; applying an insulating adhesive on a rear surface of the solar cells; laying the plurality of solar cells in sequence along a first direction; placing the solder strip on the solar cells so that, and along the first direction, one end of the solder strip abuts against a positive busbar of one of the solar cells, and at least part of the solder strip is bonded to the insulating adhesive on the solar cells; and the other end of the solder strip abuts against a negative busbar of another one of the solar cells adjacent thereto, and at least part of the solder strip is bonded to the insulating adhesive on the solar cell; curing the insulating adhesive by irradiation with an ultraviolet lamp to fixedly connect the solder strip to the solar cells, so that the plurality of solar cells are connected through the solder strip to form a solar cell string; arranging a plurality of formed solar cell strings along a second direction, and connecting two adjacent solar cell strings in series and/or in parallel to form a photovoltaic cell pack, the second direction is perpendicular to the first direction; providing a front packaging structure and a back packaging structure; and arranging the front packaging structure on a front surface of the photovoltaic cell pack, arranging the back packaging structure on a rear surface of the photovoltaic cell pack, and laminating the front packaging structure, the photovoltaic cell pack, and the back packaging structure to form the photovoltaic module.

In one or more embodiments, the applying an insulating adhesive on a rear surface of the solar cells includes: applying, along the second direction, the insulating adhesive on negative fingers on two sides of the positive busbar and/or positive fingers on two sides of the negative busbar.

In one or more embodiments, the abutting the solder strip against a positive busbar and bonding at least part of the solder strip to the insulating adhesive on the solar cell includes: bonding, along the second direction, two sides of the solder strip respectively to the insulating adhesive on the negative fingers on the two sides of the positive busbar; and/or the abutting the solder strip against a negative busbar and bonding at least part of the solder strip to the insulating adhesive on the solar cell includes: bonding, along the second direction, two sides of the solder strip respectively to the insulating adhesive on the positive fingers on the two sides of the negative busbar.

In one or more embodiments, in the curing the insulating adhesive by irradiation with an ultraviolet lamp, an irradiation time of the ultraviolet lamp ranges from 0.2 s to 0.8 s.

In one or more embodiments, in the curing the insulating adhesive by irradiation with an ultraviolet lamp, an irradiance of the ultraviolet lamp ranges from 500 m·W/cm$^2$ to 1000 m·W/cm$^2$.

In one or more embodiments, subsequent to the curing the insulating adhesive by irradiation with an ultraviolet lamp, the manufacturing method further includes: applying a reinforcing adhesive to an exposed surface of the solder strip, so that at least part of the reinforcing adhesive is bonded to the insulating adhesive and/or the rear surface of the solar cell; and curing the reinforcing adhesive by irradiation with the ultraviolet lamp.

In one or more embodiments, the applying a reinforcing adhesive to an exposed surface of the solder strip includes: applying, along the first direction, the reinforcing adhesive intermittently on the solder strip.

In one or more embodiments, in the curing the reinforcing adhesive by irradiation with the ultraviolet lamp, an irradiation time of the ultraviolet lamp ranges from 2 s to 6 s.

In one or more embodiments, in the curing the reinforcing adhesive by irradiation with the ultraviolet lamp, an irradiance of the ultraviolet lamp ranges from 1000 m·W/cm$^2$ to 2000 m·W/cm$^2$.

In a second aspect of the present disclosure, a photovoltaic module is provided, the photovoltaic module includes: a photovoltaic cell pack including a plurality of solar cell strings arranged along a second direction; a front packaging structure arranged on a front surface of the photovoltaic cell pack; and a back packaging structure arranged on a rear surface of the photovoltaic cell pack. Each of the solar cell strings includes a plurality of solar cells arranged in sequence along a first direction, and the solar cells are back contact solar cells. Each of the solar cell strings further includes a solder strip, and along the first direction, two ends of the solder strip are bonded and fixed to two adjacent solar cells through an insulating adhesive, so that the two adjacent solar cells are connected in series through the solder strip.

In one or more embodiments, along the first direction, a positive busbar of any one of the solar cells is aligned with a negative busbar of another one of the solar cells adjacent thereto; and along the first direction, the solder strip includes one end abutting against the positive busbar of one of the solar cells and the other end abutting against the negative busbar of the another one of the solar cells adjacent thereto.

In one or more embodiments, along the second direction, the insulating adhesive is provided on negative fingers on two sides of the positive busbar and/or positive fingers on two sides of the negative busbar; and along the second direction, lengths of bonding of two sides of the solder strip to the insulating adhesive are both L2, and L2 ranges from 0.1 mm to 0.2 mm.

In one or more embodiments, each of the solar cell strings further includes a reinforcing adhesive, and along the first direction, the reinforcing adhesive is provided at intervals on an outer surface of the solder strip, and at least part of the reinforcing adhesive is fixedly connected to the insulating adhesive and/or a rear surface of the solar cell; and along the first direction, a distance L3 between the reinforcing adhesive at two adjacent positions ranges from 2 mm to 10 mm.

In one or more embodiments, the solder strip is one of a circular solder strip, a rectangular solder strip, or a T-shaped solder strip.

It should be understood that the general description above and the detailed description in the following are merely exemplary and illustrative, and cannot limit the present disclosure.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
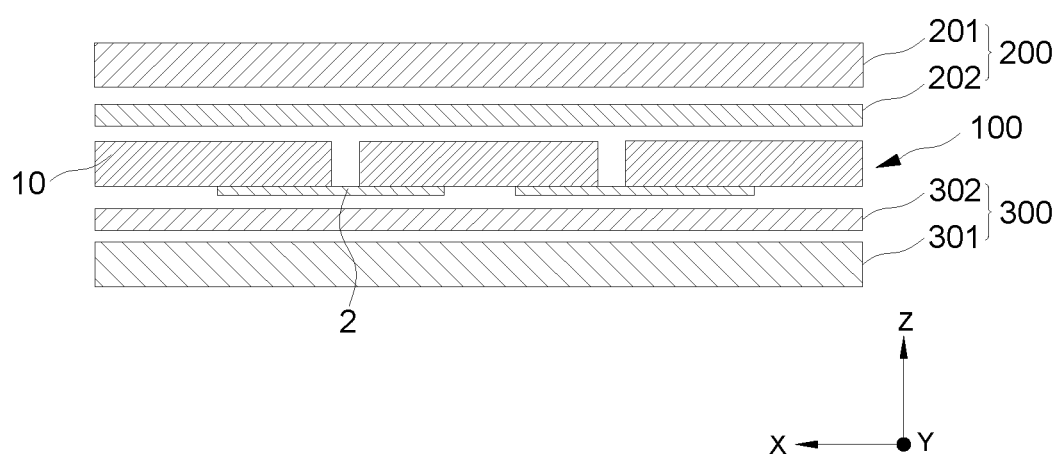
FIG. 1 is a schematic structural diagram of a photovoltaic module according to one or more embodiments of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In order to better understand the technical solutions of the present disclosure, embodiments of the present disclosure will be described in detail below in conjunction with the accompanying drawings.

It should be clear that the described embodiments are only some rather than all of the embodiments of the present disclosure. Based on the embodiments in the present disclosure, all other embodiments obtained by those of ordinary skill in the art without creative efforts fall within the protection scope of the present disclosure.

Terms used in the embodiments of the present disclosure are only for the purpose of describing specific embodiments, and are not intended to limit the present disclosure. Singular forms of "a/an", "the", and "said" used in the embodiments of the present disclosure and the appended claims are intended to include plural forms, unless otherwise clearly specified in the context.

It should be understood that the term "and/or" used herein describes an association relationship between associated objects and represents that three relationships may exist. For example, A and/or B may represent the following three cases: only A exists, both A and B exist, and only B exists. In addition, the character "/" herein generally indicates an "or" relationship between the associated objects.

It is to be noted that orientation terms such as "above", "below", "left", and "right" described in the embodiments of the present disclosure are described from the perspective shown in the accompanying drawings, and should not be construed as limiting the embodiments of the present disclosure. Besides, in this context, it is to be further understood that one element described as being connected "above" or "below" another element not only means that the element may be directly connected "above" or "below" the other element, but also means that the element may be indirectly connected "above" or "below" the other element through an intermediate element.

In an existing method for manufacturing a photovoltaic module, a solder strip is fixedly connected to a solar cell by soldering, and the specific process includes: drying an insulating adhesive on the solar cell, applying solder paste on an electrode pad of a positive busbar and/or a negative busbar, then laying the solder strip over the solder paste, and transiently heating and soldering the solder paste by using an infrared lamp. Since a positive busbar and/or a negative busbar of a back contact solar cell are/is located on a rear surface thereof, if the solder strip is fixed in the above soldering manner, soldering stress may lead to warping of the back contact solar cell, which easily causes empty soldering. Moreover, in subsequent procedures of the photovoltaic module, the solar cell is more prone to hidden cracks and even splitting, resulting in an increase in the defective rate of the photovoltaic module.

Figure 2:
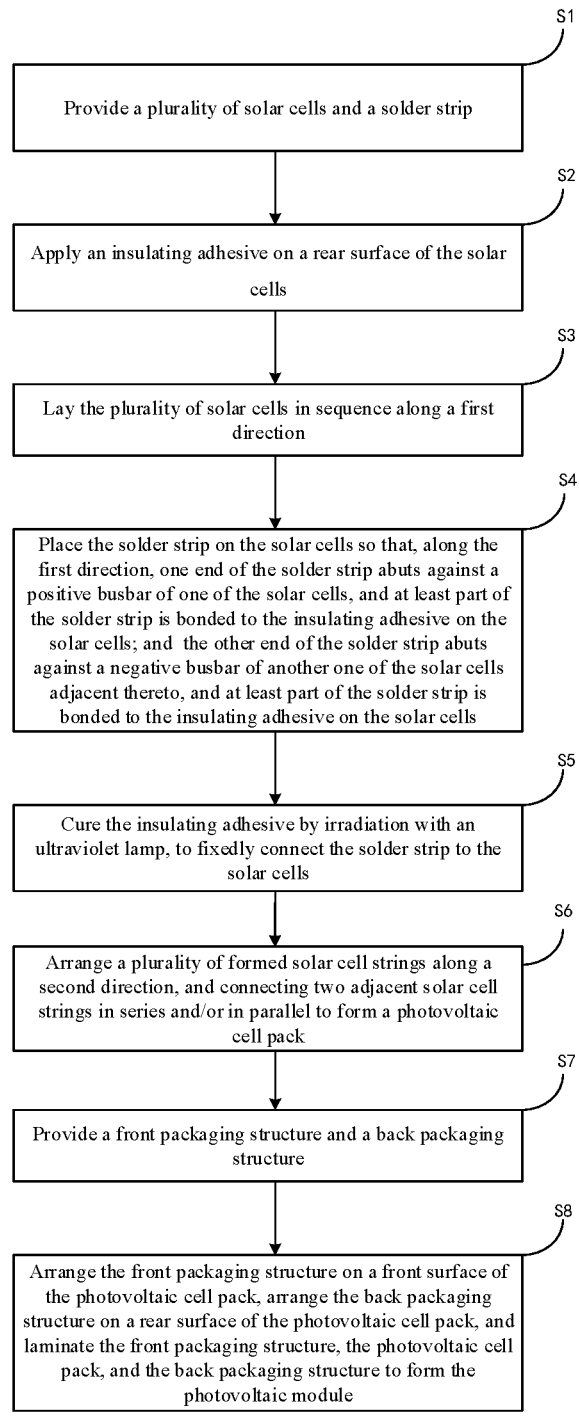
FIG. 2 is a flowchart of manufacturing a photovoltaic module according to one or more embodiments of the present disclosure.

To this end, some embodiments of the present disclosure provide a method for manufacturing a photovoltaic module. As shown in FIG. 1 and FIG. 2, the manufacturing method includes the following steps.

In step S1, a solar cell 1 and a solder strip 2 are provided, and the solar cell 1 is a back contact solar cell.

A photovoltaic cell pack 100 of the photovoltaic module includes a plurality of solar cell strings 10. Each solar cell string 10 includes a plurality of solar cells 1 arranged at intervals. Two adjacent solar cells 1 are connected through the solder strip 2.

In step S2, an insulating adhesive 11 is applied on a rear surface of the solar cell 1.

The solar cell 1 is a back contact solar cell, and a positive electrode and a negative electrode thereof are both arranged on a rear surface, which can reduce light blocking on the front surface and improve cell efficiency. Since the positive electrode and the negative electrode are on a same surface, the insulating adhesive 11 is required to be applied to prevent connection between positive and negative electrodes of a same solar cell caused by simultaneous contact of the solder strip with the positive electrode and the negative electrode, thereby achieving the purpose of preventing short circuit of the solar cell 1.

In step S3, a plurality of solar cells 1 are laid in sequence along a first direction X.

Figure 3:
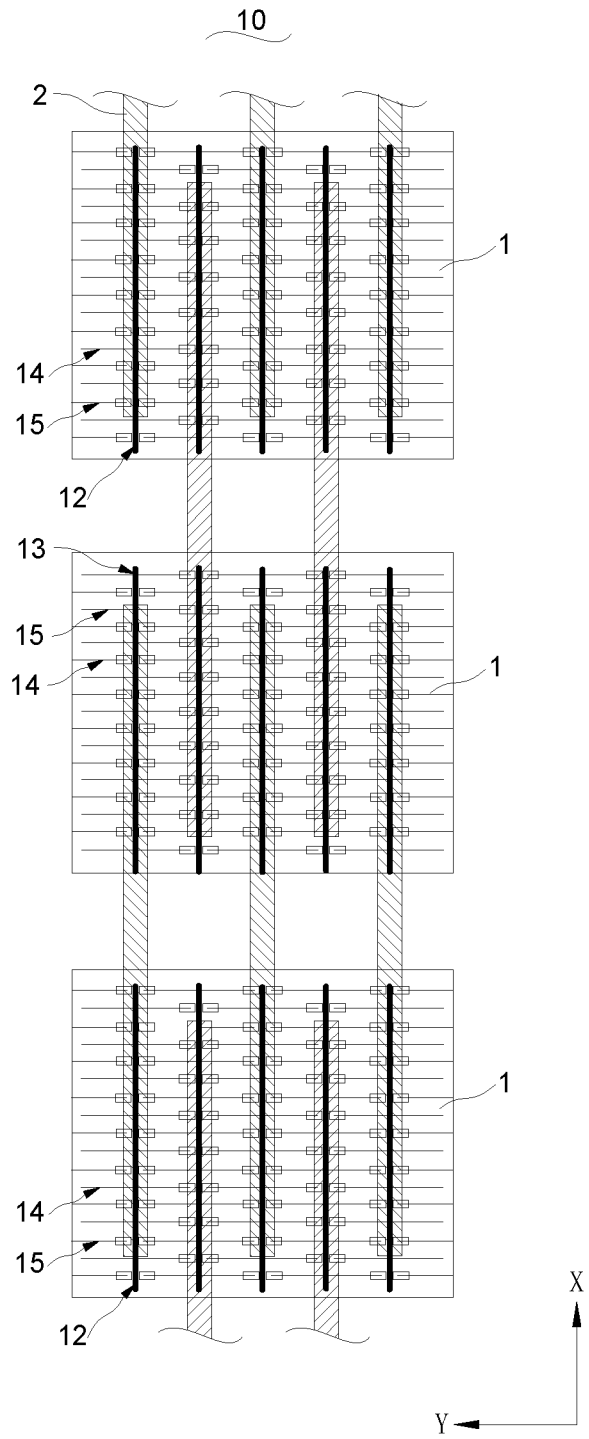
FIG. 3 is a schematic structural diagram of a solar cell string in FIG. 1.

As shown in FIG. 3, a plurality of solar cells 1 are laid at intervals in sequence along the first direction X, and a positive busbar 12 of any solar cell 1 is aligned, along the first direction X, with a negative busbar 13 of another solar cell 1 adjacent thereto.

In step S4, the solder strip 2 is placed on the solar cells 1, and along the first direction X, one end of the solder strip 2 abuts against a positive busbar 12 of one of the solar cells 1, and at least part of the solder strip 2 is bonded to the insulating adhesive 11 on the solar cell 1. The other end of the solder strip 2 abuts against a negative busbar 13 of the other of the solar cells 1 adjacent thereto, and at least part of the solder strip 2 is bonded to the insulating adhesive 11 on the solar cell 1.

As shown in FIG. 3, the solder strip 2 is horizontally placed on surfaces of two adjacent solar cells 1 along the first direction X, and two ends of the solder strip 2 abut against the positive busbar 12 of one solar cell 1 and the negative busbar 13 of the other solar cell respectively for electrical connection, so that the two adjacent solar cells 1 are electrically connected. In order to ensure that the solder strip 2 can be in stable contact with the positive busbar 12 and/or the negative busbar 13 of the solar cell 1, the solder strip 2 is also required to be bonded and fixed to the insulating adhesive 11 on the solar cell 1. For example, the solder strip 2 may be placed by using a series soldering machine, which is more efficient and able to ensure accuracy of the placement of the solder strip 2.

In step S5, the insulating adhesive 11 is cured by irradiation with an ultraviolet lamp, to fixedly connect the solder strip 2 to the solar cell 1, so that the plurality of solar cells 1 are connected through the solder strip 2 to form solar cell strings 10. The plurality of solar cell strings 10 are arranged along a second direction Y, and two adjacent solar cell strings 10 are connected in series and/or in parallel to form a photovoltaic cell pack 100.

After the insulating adhesive 11 is cured, the solder strip 2 can be fixed to the solar cell 1, which improves reliability of the connection between the solder strip 2 and the solar cell 1. As shown in FIG. 3, a plurality of solder strips 2 are required to connect two adjacent solar cells 1 (the quantity of the solder strip 2 corresponds to the quantity of the positive busbar 12 and the quantity of the negative busbar 13), and the plurality of solar cells 1 are finally connected in series to form a solar cell string 10. The plurality of solar cell strings 10 are arranged along the second direction Y, and are connected through a busbar to form the photovoltaic cell pack 100.

In step S6, a front packaging structure 200 and a back packaging structure 300 are provided.

As shown in FIG. 1, the front packaging structure 200 includes a cover plate 201 and a front packaging adhesive film 202, and the back packaging structure 300 includes a back plate 301 and a back packaging adhesive film 302. The cover plate 201 and/or the back plate 301 may be made of one of rigid materials such as tempered glass, Polyethylene Terephthalate (PET), and Polycarbonate (PC), or made of one of flexible materials such as Polyvinyl Fluoride (PVF), Ethylene-Tetra-Fluoro-Ethylene (ETFE), and Polyvinylidene Fluoride (PVDF). The front packaging adhesive film 202 and the back packaging adhesive film 302 may be made of one of materials such as Ethylene-Vinyl Acetate Copolymer (EVA), Polyolefin Elastomer (POE), and Polyvinyl Butyral (PVB). Through a packaging process, the photovoltaic cell pack 100 can be ensured to have good mechanical strength, thereby reducing influences of hail impact, wind blowing, mechanical vibration, and the like. The packaging process can also improve sealing performance of the photovoltaic cell pack 100 and improve corrosion resistance and safety thereof. Moreover, the above materials can meet packaging requirements of the photovoltaic module, and ensure that the photovoltaic module has good mechanical strength, and thus help to improve the yield and reliability of the photovoltaic module.

In step S7, the front packaging structure 200 is arranged on a front surface of the photovoltaic cell pack 100, the back packaging structure 300 is arranged on a rear surface of the photovoltaic cell pack 100, and the front packaging structure 200, the photovoltaic cell pack 100, and the back packaging structure 300 are laminated to form the photovoltaic module. In the context of the present disclosure, the front surface refers to the sunlight receiving surface of the photovoltaic cell, and the rear surface refers to the surface facing away from sunlight.

Lamination is to bond and fuse various components of the photovoltaic module together under certain temperature, pressure, and vacuum conditions, so as to protect the photovoltaic cell pack 100.

In the method for manufacturing a photovoltaic module provided according to some embodiments of the present disclosure, the fixed connection between the solder strip 2 and the solar cell 1 is realized by using the insulating adhesive 11, which, compared with the manner of connecting the solder strip 2 to the solar cell 1 by soldering in the related art, can prevent warping of the solar cell 1 caused by a transient high temperature to maintain structural stability of the solar cell 1, and then prevent hidden cracks and even splitting in subsequent procedures of the photovoltaic module, thereby helping to improve the yield of the photovoltaic module. Moreover, "applying an insulating adhesive 11" is a necessary step in the manufacturing of the photovoltaic module. In the manufacturing method according to the present disclosure, the solder strip 2 is laid when the insulating adhesive 11 is applied on a surface of the solar cell 1 and is not cured, the position of the solder strip 2 is first determined by using viscosity of the insulating adhesive 11, and then the insulating adhesive 11 is cured by irradiation with the ultraviolet lamp, so as to fix the solder strip 2. In the related art, when the solder strip 2 is connected to the solar cell 1 by soldering, there is a need to first cure the insulating adhesive 11 and then apply solder paste to the positive busbar 12 and/or the negative busbar 13. The method of the present disclosure can save manufacturing procedures, reduce manufacturing difficulty of the photovoltaic module, improve manufacturing efficiency of the photovoltaic module, save materials, and reduce the manufacturing cost of the photovoltaic module.

In addition, it is to be noted that, in the present disclosure, the second direction Y is perpendicular to the first direction X. For example, the first direction X may be a length direction of the solar cell string 10, and the second direction Y may be a width direction of the solar cell string 10.

In some embodiments, in step S2 of applying an insulating adhesive 11 on a rear surface of the solar cell 1, the manufacturing method includes:

Applying, along the second direction Y, the insulating adhesive 11 on negative fingers 15 on two sides of the positive busbar 12 and/or positive fingers 14 on two sides of the negative busbar 13.

Figure 4:
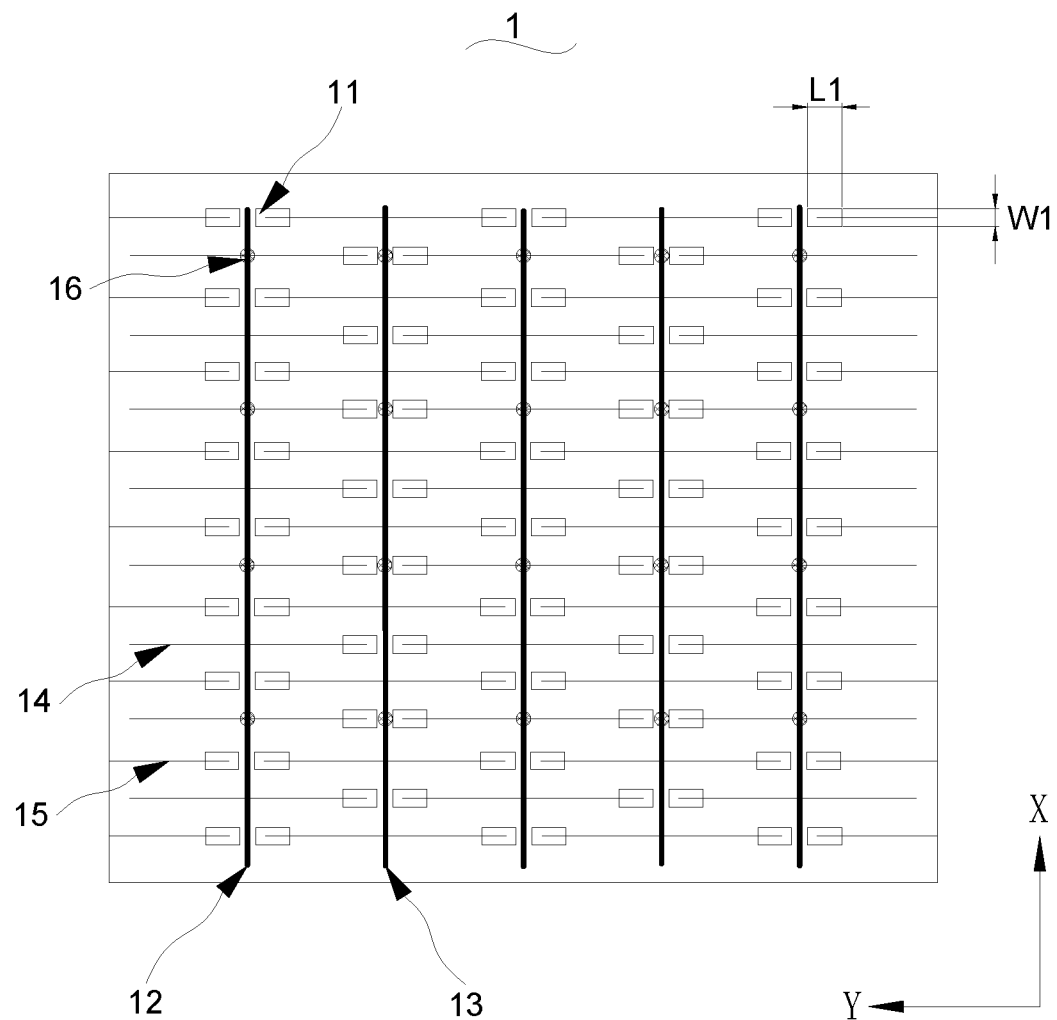
FIG. 4 is a schematic structural diagram of the solar cells in FIG. 3 according to some embodiments.

As shown in FIG. 4, the positive electrode includes the positive busbar 12 and the positive fingers 14, and two sides of the positive busbar 12 along the second direction Y are respectively connected to a plurality of positive fingers 14. The negative electrode includes the negative busbar 13 and the negative fingers 15, and two sides of the negative busbar 13 along the second direction Y are respectively connected to a plurality of negative fingers. The positive fingers 14 and the negative fingers 15 are respectively configured to collect currents in a cell diffusion layer and transfer the currents to the positive busbar 12 and the negative busbar 13. The positive busbar 12 and the negative busbar 13 are configured to transmit the currents collected from the positive fingers 14 and the negative fingers 15 to the outside of the solar cell 1.

As shown in FIG. 4, along the second direction Y, the positive busbar 12 is closer to the negative fingers 15 on the two sides thereof. Therefore, there is a need to apply the insulating adhesive 11 on one end of the negative fingers 15 close to the positive busbar 12. Similarly, the insulating adhesive 11 is further required to be applied on one end of the positive fingers 14 close to the negative busbar 13. In this way, even if the solder strip 2 slightly deviates during the placement and contacts the positive electrode and the negative electrode on a same solar cell 1 at the same time (contacts the positive busbar 12 and the negative fingers 15 at the same time or contacts the positive fingers 14 and the negative busbar 13 at the same time), the solar cell 1 may not be short circuited, which improves the yield of the photovoltaic module.

It is to be noted that, as shown in FIG. 4, the positive busbar 12 and/or the negative busbar 13 are/is connected to a body of the solar cell 1 through electrode pads 16. The electrode pads 16 are arranged at intervals along the first direction X and can be electrically connected to the solder strip 2. When the solder strip 2 is bonded to the insulating adhesive 11, since a height of the electrode pad 16 is higher than a height of the positive busbar 12 and a height of the negative busbar 13, the solder strip 2 can completely fit the electrode pad 16 to ensure the electrical connection between the solder strip 2 and the solar cell 1. Therefore, in some situations, due to the influence of the electrode pad 16, even if there may be gaps in some regions between the solder strip 2 and the positive busbar 12 and/or the negative busbar 13 so that complete fitting is not applicable, the electrical connection between the solder strip 2 and the solar cell 1 may not be affected.

Figure 5:
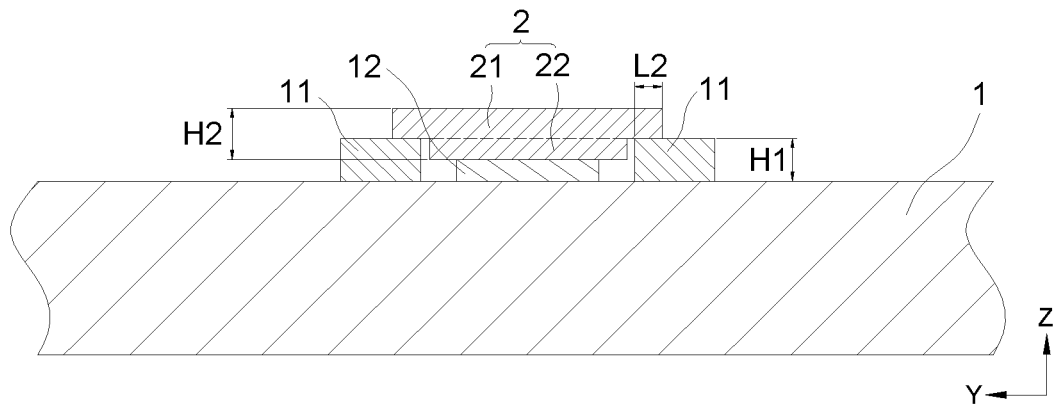
FIG. 5 is a sectional view of FIG. 3 according to some embodiments.

In some embodiments, as shown in FIG. 5, the thickness H1 of the applied insulating adhesive 11 is greater than 30 μm. H1 may be, for example, 30 μm, 32 μm, 35 μm, 40 μm, 44 μm, 48 μm, 50 μm, 53 μm, 59 μm, 65 μm, or 70 μm, or other values in the above range, which is not limited in the present disclosure.

If the thickness H1 of the applied insulating adhesive 11 is excessively small (e.g., less than or equal to 30 μm), when the solder strip 2 is placed, stable contact between the solder strip 2 and the insulating adhesive 11 cannot be ensured, which may affect stability of the connection between the solder strip 2 and the solar cell 1.

Figure 13:
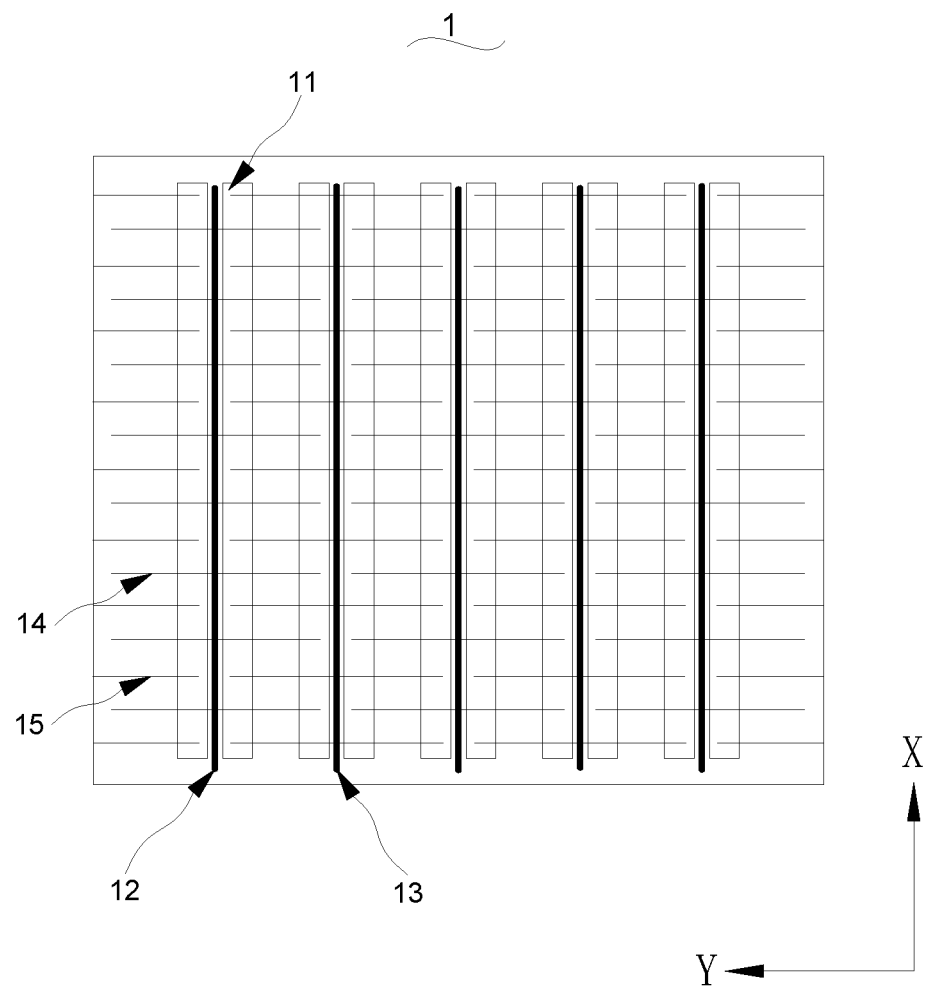
FIG. 13 is a schematic structural diagram of the solar cell string in FIG. 3 according to some embodiments.
Figure 14:
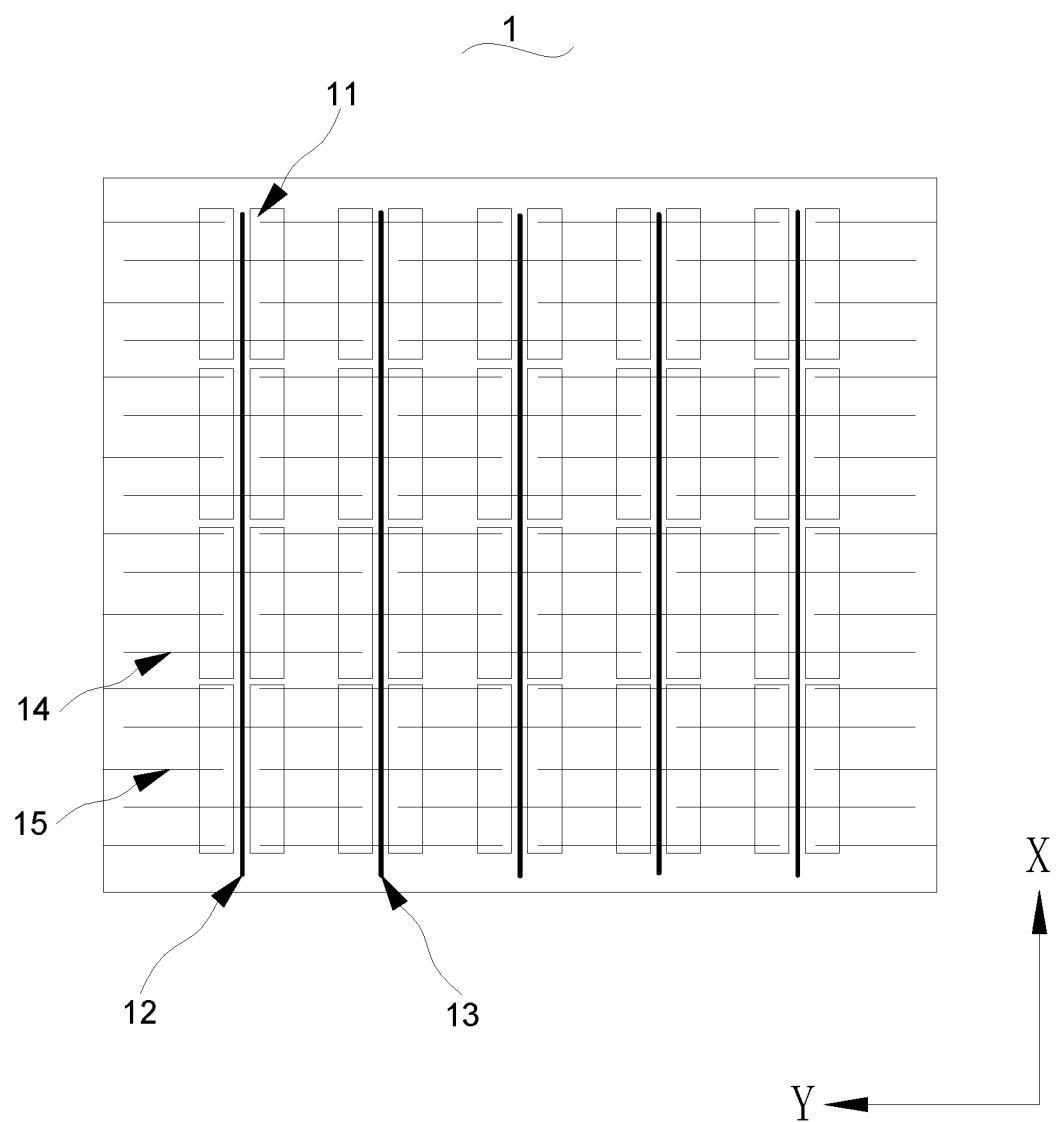
FIG. 14 is a schematic structural diagram of the solar cell string in FIG. 3 according to some embodiments.

When applied, the insulating adhesive 11 may be applied consecutively along the first direction X (as shown in FIG. 13), or applied at intervals along the first direction X (as shown in FIG. 14). In this regard, it should be guaranteed that the insulating adhesive 11 is applied on one end of each negative finger 15 close to the positive busbar 12 and the insulating adhesive 11 is applied on one end of each positive finger 14 close to the negative busbar 13.

On the basis of ensuring insulation effects of the positive and negative electrodes, in order to reduce the cost and the weight of the photovoltaic module, in some embodiments, the insulating adhesive 11 is applied at intervals in the first direction X and there is a need to minimize the usage amount of the insulating adhesive 11. For example, as shown in FIG. 4, along the first direction X, an applying width W1 of the insulating adhesive 11 at each position ranges from 200 μm to 600 μm. W1 may be, for example, 200 μm, 230 μm, 250 μm, 300 μm, 350 μm, 400 μm, 440 μm, 480 μm, 500 μm, 550 μm, 570 μm, or 800 μm, or other values in the above range, which is not limited in the present disclosure.

When an applying length L1 of the insulating adhesive 11 is determined, if the applying width W1 of the insulating adhesive 11 is excessively small (e.g., less than 200 μm), applying areas of the insulating adhesive 11 on the positive finger 14 and/or the negative finger 15 may be excessively small, thereby leading to an insufficient connection area between the solar cell 1 and the solder strip 2 and affecting stability of the connection with the solder strip 2. If the applying width W1 of the insulating adhesive 11 is excessively large (e.g., greater than 600 μm), the insulation effect or the stability of the connection with the solder strip 2 may not be improved, but the insulating adhesive 11 may be wasted, resulting in an increase in the weight and the cost of the photovoltaic module.

As shown in FIG. 4, along the second direction Y, the applying length L1 of the insulating adhesive 11 at each position ranges from 800 μm to 1200 μm. L1 may be, for example, 800 μm, 820 μm, 850 μm, 880 μm, 900 μm, 930 μm, 970 μm, 1000 μm, 1050 μm, 1080 μm, 1100 μm, 1120 μm, 1150 μm, or 1200 μm, or other values in the above range, which is not limited in the present disclosure.

When the applying width W1 of the insulating adhesive 11 is determined, if the applying length L1 of the insulating adhesive 11 is excessively small (e.g., less than 800 μm), applying areas of the insulating adhesive 11 on the positive finger 14 and/or the negative finger 15 may be excessively small, thereby leading to an insufficient connection area between the solar cell 1 and the solder strip 2 and affecting stability of the connection with the solder strip 2. If the applying length L1 of the insulating adhesive 11 is excessively large (e.g., greater than 1200 μm), the insulation effect or the stability of the connection with the solder strip 2 may not be improved, but the insulating adhesive 11 may be wasted, resulting in an increase in the weight and the cost of the photovoltaic module.

Therefore, when the applying length L1 of the insulating adhesive 11 ranges from 800 μm to 1200 μm and the applying width W1 ranges from 200 μm to 600 μm, the stability of the connection between the solder strip 2 and the solar cell 1 can be ensured, and the weight and the manufacturing cost of the photovoltaic module can be appropriately reduced.

In the present disclosure, the insulating adhesive 11 may be one or more of silicone, acrylic acid, and epoxy resin. "Applying an insulating adhesive 11" may be attaching, by screen printing, a template with a pattern to a screen for applying the insulating adhesive. The solar cell 1 is placed under the screen with the template, and the insulating adhesive 11 passes through meshes in the middle of the screen under extrusion of a scraper and is applied on the rear surface of the solar cell 1. The template on the screen seals part of small holes of the screen, and the insulating adhesive 11 cannot pass therethrough. Therefore, only the position corresponding to the pattern of the screen on the solar cell 1 (the negative fingers 15 on two sides of the positive busbar 12 and/or the positive fingers 14 on two sides of the negative busbar 13) is coated with the insulating adhesive 11.

In addition, "applying an insulating adhesive" may alternatively be using, by mask printing, a mask applied with a pattern for applying the insulating adhesive. The principle and the effect are the same as those of screen printing. Details are not described herein again.

In some embodiments, in step S4 of abutting the solder strip 2 against a positive busbar 12 and bonding at least part of the solder strip 2 to the insulating adhesive 11 on the solar cell 1, the manufacturing method includes: bonding, along the second direction Y, two sides of the solder strip 2 respectively to the insulating adhesive 11 on the negative fingers 15 on the two sides of the positive busbar 12.

Additionally or alternatively, in the abutting the solder strip 2 against a negative busbar 13 and bonding at least part of the solder strip 2 to the insulating adhesive 11 on the solar cell 1, the manufacturing method includes: bonding, along the second direction Y, two sides of the solder strip 2 respectively to the insulating adhesive 11 on the positive fingers 14 on the two sides of the negative busbar 13.

As shown in FIG. 5, when the two sides of the solder strip 2 are both bonded and fixed to the insulating adhesive 11 along the second direction Y, the position of the solder strip 2 can be fixed, which prevents the influence of possible movement of the solder strip 2 on the electrical connection with the solar cell 1.

For example, as shown in FIG. 5, along the second direction Y, lengths of bonding of two sides of the solder strip 2 to the insulating adhesive 11 are both L2, and L2 ranges from 0.1 mm to 0.2 mm. L2 may be, for example, 0.1 mm, 0.11 mm, 0.12 mm, 0.13 mm, 0.14 mm, 0.15 mm, 0.16 mm, 0.17 mm, 0.18 mm, 0.19 mm, or 0.2 mm, or other values in the above range, which is not limited in the present disclosure.

If the length of bonding L2 is excessively small (e.g., less than 0.1 mm), a connection area between the solder strip 2 and the solar cell 1 may be insufficient, which affects the stability of the connection with the solder strip 2. If the length of bonding L2 is excessively large (e.g., greater than 0.2 mm), a solder strip 2 with a larger width is required, but the widened solder strip 2 may lead to an increase in the cost of the photovoltaic module. If the width of the solder strip 2 remains unchanged, an applying position of the insulating adhesive 11 is required to be set closer to the positive busbar 12 and/or the negative busbar 13. However, this may increase applying difficulty of the insulating adhesive and easily lead to defective photovoltaic modules.

Therefore, when the lengths of bonding L2 between the two sides of the solder strip 2 and the insulating adhesive 11 range from 0.1 mm to 0.2 mm, the stability of the connection between the solder strip 2 and the insulating adhesive 11 can be ensured, and the yield of the photovoltaic module can be improved.

In some embodiments, in step S5 of curing the insulating adhesive 11 by irradiation with an ultraviolet lamp, irradiation time of the ultraviolet lamp ranges from 0.2 s to 0.8 s, which may be, for example, 0.2 s, 0.25 s, 0.3 s, 0.35 s, 0.4 s, 0.45 s, 0.5 s, 0.55 s, 0.6 s, 0.65 s, 0.7 s, 0.75 s, or 0.8 s, or other values in the above range, which is not limited in the present disclosure.

If the irradiation time of the ultraviolet lamp is excessively short (e.g., shorter than 0.2 s), the insulating adhesive 11 cannot be completely cured, thereby leading to an insufficiently strong connection between the solar cell 1 and the solder strip 2. If the irradiation time of the ultraviolet lamp is excessively long (e.g., longer than 0.8 s), the curing has been completed, which may not improve the curing effect but may lead to reduction in manufacturing efficiency of the photovoltaic module.

Therefore, the irradiation time of the ultraviolet lamp ranges from 0.2 s to 0.8 s, which can improve the manufacturing efficiency of the photovoltaic module on the basis of ensuring that the solder strip 2 can be firmly connected to the solar cell 1.

In some embodiments, in step S5 of curing the insulating adhesive 11 by irradiation with an ultraviolet lamp, irradiance of the ultraviolet lamp ranges from 500 m·W/cm$^2$ to 1000 m·W/cm$^2$, which may be, for example, 500 m·W/cm$^2$, 550 m·W/cm$^2$, 600 m·W/cm$^2$, 650 m·W/cm$^2$, 700 m·W/cm$^2$, 750 m·W/cm$^2$, 800 m·W/cm$^2$, 850 m·W/cm$^2$, 900 m·W/cm$^2$, 950 m·W/cm$^2$, or 1000 m·W/cm$^2$, or other values in the above range, which is not limited in the present disclosure.

The irradiance refers to radiation flux per unit area of an illuminated surface. If the irradiance of the ultraviolet lamp is excessively low (e.g., less than 500 m·W/cm$^2$), in order to ensure the curing effect of the insulating adhesive 11, the irradiation time of the ultraviolet lamp is required to be extended, which leads to a decrease in the efficiency of the curing step. If the irradiance of the ultraviolet lamp is excessively high (e.g., greater than 1000 m·W/cm$^2$), energy consumption of the ultraviolet lamp may be excessively large, thereby leading to an increase in the manufacturing cost of the photovoltaic module.

Therefore, when the insulating adhesive 11 is cured, the irradiance of the ultraviolet lamp ranges from 500 m·W/cm$^2$ to 1000 m·W/cm$^2$, which can improve the manufacturing efficiency of the photovoltaic module and can also appropriately reduce the manufacturing cost of the photovoltaic module.

Figure 6:
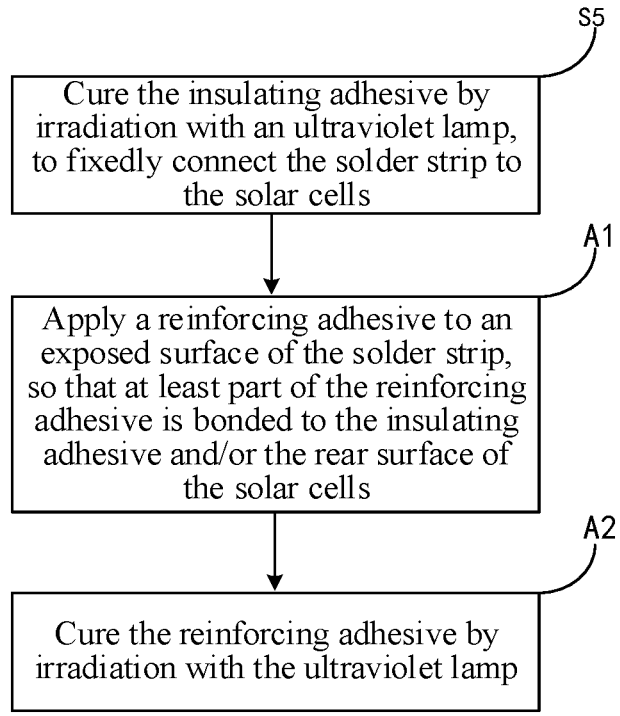
FIG. 6 is a flowchart of manufacturing a photovoltaic module according to one or more embodiments of the present disclosure.

In some embodiments, as shown in FIG. 6, subsequent to step S5, the manufacturing method further includes the following steps.

In step A1, a reinforcing adhesive 3 is applied to an exposed surface of the solder strip 2, so that at least part of the reinforcing adhesive 3 is bonded to the insulating adhesive 11 and/or the rear surface of the solar cell 1.

Figure 7:
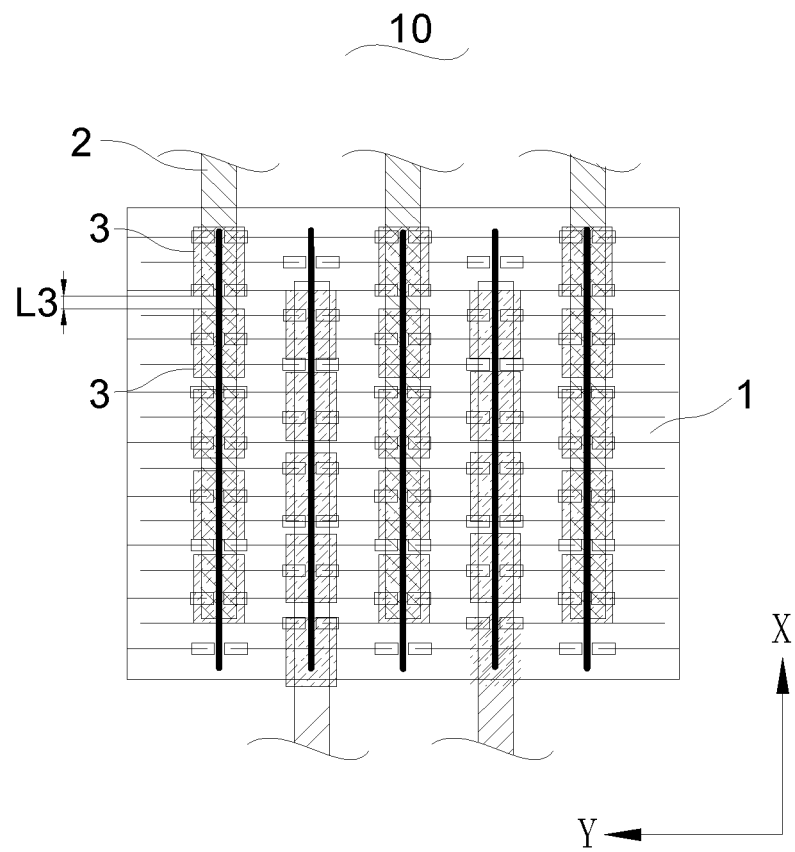
FIG. 7 is a schematic structural diagram the solar cell string in FIG. 3 after a reinforcing adhesive is applied.
Figure 8:
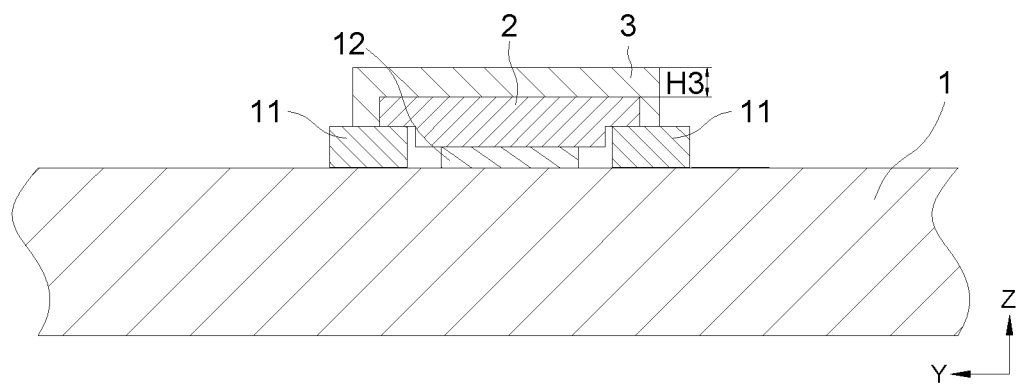
FIG. 8 is a sectional view of FIG. 7.

As shown in FIG. 7 and FIG. 8, the reinforcing adhesive 3 is provided on a surface of the solder strip 2 that is not in contact with the positive busbar 12 and/or the negative busbar 13 and the insulating adhesive 11 to wrap the solder strip 2.

In step A2, the reinforcing adhesive 3 is cured by irradiation with the ultraviolet lamp.

As shown in FIG. 8, along the second direction Y, two ends of the reinforcing adhesive 3 are bonded to the insulating adhesive 11 or bonded to the rear surface of the solar cell 1, which prevents falling off of the cured reinforcing adhesive 3 from the surface of the solder strip 2. The cured reinforcing adhesive 3 can wrap the solder strip 2, which restricts movement of the solder strip 2 along a thickness direction Z of the solar cell 1, enables the mutual tension force between the solder strip 2 and the solar cell 1, further improves the stability of the connection between the solder strip 2 and the solar cell 1, and prevents falling off of the solder strip 2 from the solar cell 1.

Figure 9:
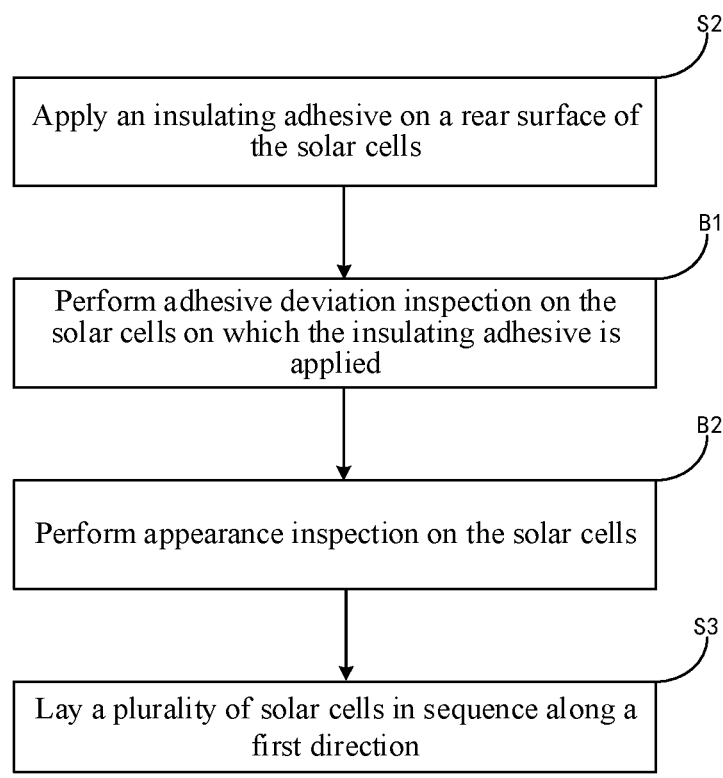
FIG. 9 is a flowchart of manufacturing a photovoltaic module according to one or more embodiments of the present disclosure.

In some embodiments, as shown in FIG. 9, subsequent to step S2 and prior to step S3, the manufacturing method further includes the following steps.

In step B1, adhesive deviation inspection is performed on the solar cell 1 on which the insulating adhesive 11 is applied.

The adhesive deviation inspection is mainly to check an adhesive application result of the insulating adhesive 11 to see whether there is adhesive position deviation, adhesive shortage, adhesive breakage, or adhesive overflow. For example, manual visual inspection may be replaced with an auto optical inspection (AOI) process, i.e., by an auto optical detector, so as to improve inspection efficiency and accuracy of inspection results.

In step B2, appearance inspection is performed on the solar cell 1.

The appearance inspection is mainly to inspect the thickness, defects, flatness, and the like of the solar cell 1. At the same time, the color of the solar cell 1 should remain uniform without any obvious color difference.

Figure 10:
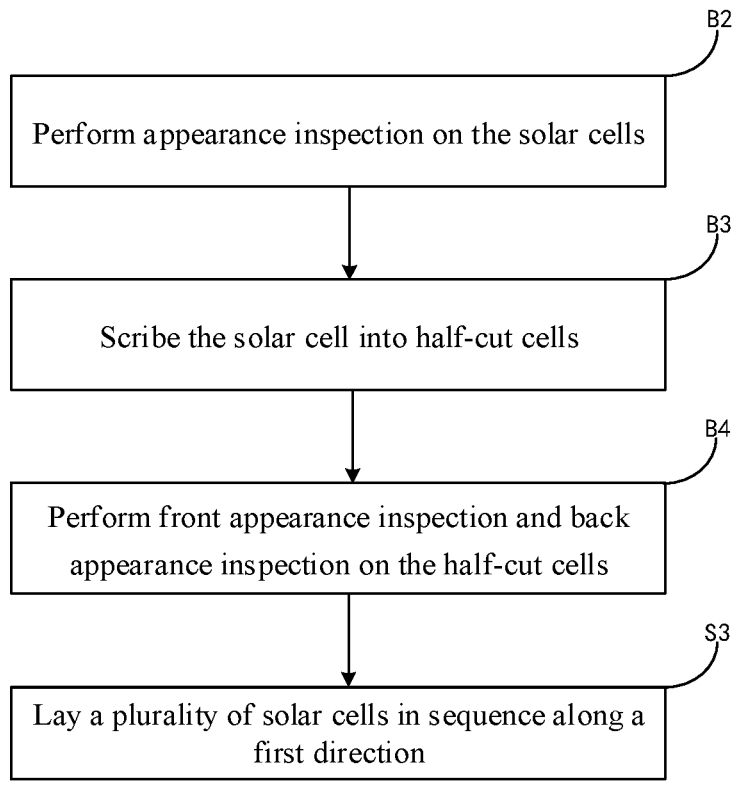
FIG. 10 is a flowchart of manufacturing a photovoltaic module according to one or more embodiments of the present disclosure.

In some embodiments, as shown in FIG. 10, subsequent to step B2 and prior to step S3, the manufacturing method further includes the following steps.

In step B3, the solar cell 1 is scribed into half-cut cells.

The photovoltaic module is generally manufactured by using the half-cut cells. That is, a complete cell is cut by laser into two half-cells, and the half-cells are the half-cut cells.

In step B4, front appearance inspection and back appearance inspection are performed on the half-cut cells.

Thicknesses, defects, flatness, and the like of the half-cut cells are inspected, to ensure that there are no scratches or splits and that the membrane is not dirty.

As can be seen from the above steps, in the present disclosure, the solar cell 1 used to manufacture the solar cell string 10 may be a whole cell or half-cut cells.

In some embodiments, in step A1 of applying a reinforcing adhesive 3 to an exposed surface of the solder strip 2, the manufacturing method includes: applying, along the first direction X, the reinforcing adhesive 3 intermittently to the solder strip 2.

The reinforcing adhesive 3 is not required to be applied to an entire outer surface of the solder strip 2, and the effect of reinforcing the solder strip 2 can be achieved by intermittent application. As shown in FIG. 7, along the first direction X, a distance L3 between the reinforcing adhesive 3 at two adjacent positions ranges from 2 mm to 10 mm. L3 may be, for example, 2 mm, 3 mm, 4 mm, 5 mm, 6 mm, 7 mm, 8 mm, 9 mm, or 10 mm, or other values in the above range, which is not limited in the present disclosure.

If the distance L3 between the reinforcing adhesive 3 at two adjacent positions is excessively large (e.g., greater than 10 mm), the area of the applied reinforcing adhesive 3 may be insufficient, resulting in a non-ideal reinforcing effect of the reinforcing adhesive 3 on the solder strip 2. If the distance L3 between the reinforcing adhesive 3 at two adjacent positions is excessively small (e.g., less than 2 mm), the reinforcing effect of the reinforcing adhesive 3 on the solder strip 2 may no longer be improved, and the reinforcing adhesive 3 may be wasted, resulting in an increase in the weight and the cost of the photovoltaic module.

Therefore, the distance L3 between the reinforcing adhesive 3 at two adjacent positions ranges from 2 mm to 10 mm, which can ensure the reinforcing effect of the reinforcing adhesive 3 on the solder strip 2 and can also save the usage amount of the reinforcing adhesive 3, thereby preventing waste of material and appropriately reducing the weight and the cost of the photovoltaic module.

In some embodiments, the thickness H3 of the applied reinforcing adhesive 3 ranges from 50 μm to 300 μm. H3 may be, for example, 50 μm, 80 μm, 100 μm, 120 μm, 150 μm, 180 μm, 200 μm, 230 μm, 260 μm, 290 μm, or 300 μm, or other values in the above range, which is not limited in the present disclosure.

If the application thickness H3 of the reinforcing adhesive 3 is excessively small (e.g., less than 50 μm), stable contact between the reinforcing adhesive 3 and the insulating adhesive 11 and/or the rear surface of the solar cell 1 cannot be ensured, and after the reinforcing adhesive 3 is cured, the reinforcing adhesive 3 may easily fall off, which affects the reinforcing effect of the reinforcing adhesive 3. If the application thickness H3 of the reinforcing adhesive 3 is excessively large (e.g., greater than 300 μm), the curing effect of the solder strip 2 may not be improved, but the reinforcing adhesive 3 may be wasted, resulting in an increase in the weight, the thickness, and the cost of the photovoltaic module.

Therefore, when the application thickness H3 of the reinforcing adhesive 3 ranges from 50 μm to 300 μm, the reinforcing effect of the reinforcing adhesive 3 on the connection between the solder strip 2 and the solar cell 1 can be ensured, and the usage amount of the reinforcing adhesive 3 can be saved, thereby preventing waste of material and appropriately reducing the weight, the thickness, and the cost of the photovoltaic module.

The reinforcing adhesive 3 is a light-curing adhesive, which may be, for example, made of silicone and acrylic resin. The acrylic resin includes, but is not limited to, epoxy acrylate, polyurethane acrylate, polyester acrylate, polyether acrylate, acrylated acrylate resin or vinyl resin, and the like.

In some embodiments, in step A2 of curing the reinforcing adhesive 3 by irradiation with the ultraviolet lamp, irradiation time of the ultraviolet lamp ranges from 2 s to 6 s, which may be, for example, 2 s, 2.5 s, 3 s, 3.5 s, 4 s, 4.5 s, 5 s, 5.5 s, or 6 s, or other values in the above range, which is not limited in the present disclosure.

Since the area of the applied reinforcing adhesive 3 is larger than that of the insulating adhesive 11, it takes a longer irradiation time to cure the reinforcing adhesive 3. However, if the irradiation time of the ultraviolet lamp is excessively short (e.g., shorter than 2 s), the reinforcing adhesive 3 cannot be completely cured, and strength of the connection between the solder strip 2 and the solar cell 1 cannot be further improved. If the irradiation time of the ultraviolet lamp is excessively long (e.g., longer than 6 s), the curing has been completed, which may not improve the curing effect but may lead to reduction in manufacturing efficiency of the photovoltaic module.

Therefore, the irradiation time of the ultraviolet lamp ranges from 2 s to 6 s, which can improve the manufacturing efficiency of the photovoltaic module on the basis of ensuring that the reinforcing adhesive 3 has been completely cured.

In some embodiments, in step A2 of curing the reinforcing adhesive 3 by irradiation with the ultraviolet lamp, irradiance of the ultraviolet lamp ranges from 1000 m·W/cm² to 2000 m·W/cm², which may be, for example, 1000 m·W/cm², 1100 m·W/cm², 1200 m·W/cm², 1300 m·W/cm², 1400 m·W/cm², 1500 m·W/cm², 1600 m·W/cm², 1700 m·W/cm², 1800 m·W/cm², 1900 m·W/cm², or 2000 m·W/cm², or other values in the above range, which is not limited in the present disclosure.

If the irradiance of the ultraviolet lamp is excessively low (e.g., less than 1000 m·W/cm²), in order to ensure the curing effect of the reinforcing adhesive 3, the irradiation time of the ultraviolet lamp is required to be extended, which leads to a decrease in the efficiency of the curing step. If the irradiance of the ultraviolet lamp is excessively high (e.g., greater than 2000 m·W/cm²), energy consumption of the ultraviolet lamp may be excessively large, thereby leading to an increase in the manufacturing cost of the photovoltaic module.

Therefore, when the reinforcing adhesive 3 is cured, the irradiance of the ultraviolet lamp ranges from 1000 m·W/cm² to 2000 m·W/cm², which can improve the manufacturing efficiency of the photovoltaic module and can also appropriately reduce the manufacturing cost of the photovoltaic module.

In some embodiments, for step S5 and/or step A2, an irradiation temperature of the ultraviolet lamp ranges from 200° C. to 400° C., which may be, for example, 200° C., 220° C., 250° C., 280° C., 300° C., 330° C., 360° C., 390° C., or 400° C., or other values in the above range, which is not limited in the present disclosure.

If the temperature is excessively low (e.g., less than 200° C.), the temperature required for the insulating adhesive 11 and/or the reinforcing adhesive 3 may be extended, which reduces efficiency of the curing step. If the temperature is excessively high (e.g., greater than 400° C.), the insulating adhesive 11 and/or the reinforcing adhesive 3 are/is prone to dehydration and failure due to a high temperature.

Therefore, when the irradiation temperature of the ultraviolet lamp ranges from 200° C. to 400° C., the manufacturing efficiency of the photovoltaic module can be improved, and the yield of the photovoltaic module can also be improved.

It is to be noted that, in the present disclosure, an infrared soldering head of the existing series soldering machine is replaced by a UV light box, so step S5 and/or step A2 may be performed in the UV light box. A finished UV light box may alternatively be used, which is not limited in the present disclosure.

Some embodiments of the present disclosure further provide a photovoltaic module. As shown in FIG. 1 and FIG. 3, the photovoltaic module includes a photovoltaic cell pack 100, a front packaging structure 200, and a back packaging structure 300. The photovoltaic cell pack 100 includes a plurality of solar cell strings 10 arranged along the second direction Y. The front packaging structure 200 is arranged on the front surface of the photovoltaic cell pack 100. The back packaging structure 300 is arranged on the rear surface of the photovoltaic cell pack 100. Each of the solar cell strings 10 includes a plurality of solar cells 1 arranged in sequence along a first direction X, and the solar cells 1 are back contact solar cells. Each of the solar cell strings 10 further includes a solder strip 2. Along the first direction X, two ends of the solder strip 2 are bonded and fixed to two adjacent solar cells 1 through an insulating adhesive 11, so that the two adjacent solar cells 1 are connected in series through the solder strip 2.

The solder strip 2 connects the plurality of solar cells 1 in series to form one solar cell string 10. The plurality of solar cell strings 10 are connected in series/parallel to form the photovoltaic cell pack 100. In addition to its basic function of preventing short circuit of positive and negative electrodes of the solar cell 1, the insulating adhesive 11 can also be used to fix the solder strip 2 to ensure stable contact of the solder strip 2 with the positive busbar 12 and/or the negative busbar 13 of the solar cell 1. In the related art, the insulating adhesive 11, after being applied on the rear surface of the solar cell 1, may be immediately formed through a high-temperature curing treatment. That is, the solder strip 2 and the insulating adhesive 11 are not connected by bonding, and the solder strip 2 is fixed to the positive busbar 12 and/or the negative busbar 13 by soldering. In the present disclosure, the connection between the solder strip 2 and the busbar by bonding is replaced by the connection between the insulating adhesive 11 and the solder strip 2 through bonding, which can prevent warping of the solar cell 1 and help to improve the yield of the photovoltaic module.

In addition, in the related art, when the solder strip 2 is connected to the solar cell 1 by soldering, there is also a need to apply solder paste to the positive busbar 12 and/or the negative busbar 13. The photovoltaic module provided according to the present disclosure can save manufacturing procedures, reduce manufacturing difficulty of the photovoltaic module, improve manufacturing efficiency of the photovoltaic module, save materials, and thus reduce the manufacturing cost of the photovoltaic module.

In some embodiments, as shown in FIG. 3, along the first direction X, a positive busbar 12 of any one of the solar cells 1 is aligned with a negative busbar 13 of the other one of the solar cells 1 adjacent thereto, and along the first direction X, the solder strip 2 has one end abutting against the positive busbar 12 of one of the solar cells 1 and the other end abutting against the negative busbar 13 of the other one of the solar cells 1 adjacent thereto.

When the positive busbar 12 of one solar cell 1 is aligned, along the first direction X, with the negative busbar 13 of the other solar cell 1, it is convenient to place the solder strip 2 vertically to ensure that two adjacent solar cells 1 are electrically connected and prevent short circuit of the solar cell 1 caused by deviation of the solder strip 2.

In some embodiments, as shown in FIG. 4, along the second direction Y, the insulating adhesive 11 is provided on negative fingers 15 on two sides of the positive busbar 12 and/or positive fingers 14 on two sides of the negative busbar 13. In this way, short circuit of the solar cell 1 can be effectively prevented, and the yield of the photovoltaic module is improved.

For example, the insulating adhesive 11 may be applied consecutively along the first direction X (as shown in FIG. 13), or applied at intervals along the first direction X (as shown in FIG. 14 and FIG. 4). In this regard, it should be guaranteed that the insulating adhesive 11 is provided on one end of each negative finger 15 close to the positive busbar 12 and the insulating adhesive 11 is provided on one end of each positive finger 14 close to the negative busbar 13. Along the second direction Y, the lengths of bonding L2 between the two sides of the solder strip 2 and the insulating adhesive 11 are both L2, and L2 ranges from 0.1 mm to 0.2 mm, which can ensure a good bonding effect of the solder strip 2 and the insulating adhesive 11, and can maintain a stable connection, and thus improve the yield of the photovoltaic module.

In some embodiments, as shown in FIG. 7, the solar cell string 10 further includes a reinforcing adhesive 3, and along the first direction X. The reinforcing adhesive 3 is provided at intervals on an outer surface of the solder strip 2, and at least part of the reinforcing adhesive 3 is fixedly connected to the insulating adhesive 11 and/or the rear surface of the solar cell 1. Along the first direction X, a distance L3 between the reinforcing adhesive 3 at two adjacent positions ranges from 2 mm to 10 mm.

The reinforcing adhesive 3 covers the outer surface of the solder strip 2, with two ends bonded to the insulating adhesive 11 and/or the rear surface of the solar cell 1, which prevents falling off of the cured reinforcing adhesive 3 from the surface of the solder strip 2. The cured reinforcing adhesive 3 can wrap the solder strip 2, which restricts movement of the solder strip 2 along a thickness direction Z of the solar cell 1, thus enables a mutual tension force between the solder strip 2 and the solar cell 1, further improves the stability of the connection between the solder strip 2 and the solar cell 1, and thereby preventing falling off of the solder strip 2 from the solar cell 1. When the distance L3 between the reinforcing adhesive 3 at two adjacent positions ranges from 2 mm to 10 mm, the reinforcing effect of the reinforcing adhesive 3 on the solder strip 2 can be ensured, and the usage amount of the reinforcing adhesive 3 can be saved, thereby preventing waste of material and appropriately reducing the weight and the cost of the photovoltaic module.

In some embodiments, the solder strip 2 is one of a circular solder strip, a rectangular solder strip, and a T-shaped solder strip, or in other shapes, which is not limited in the present disclosure. It should be made clear that the shape of the solder strip refers to the shape of the cross-section of the solder strip.

Figure 11:
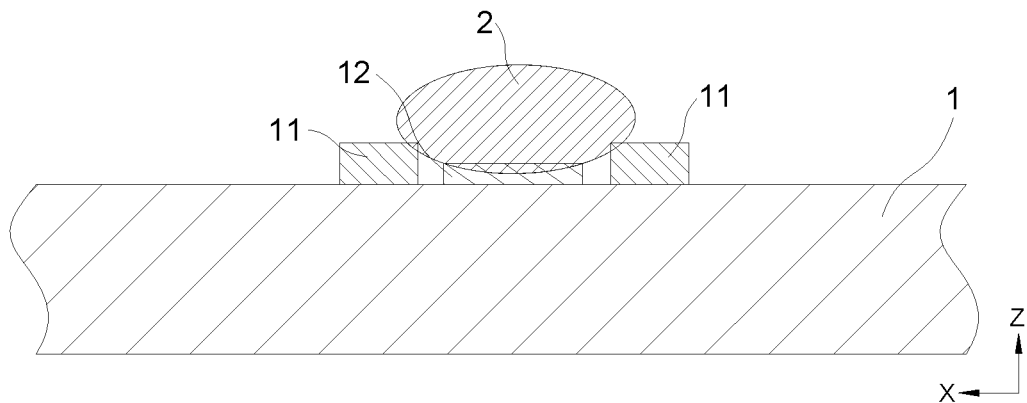
FIG. 11 is a sectional view of FIG. 3 according to some embodiments.

As shown in FIG. 11, when the solder strip 2 is the circular solder strip, a diameter D1 thereof ranges from 160 μm to 1000 μm, which may be, for example, 160 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1000 μm, or other values in the above range, which is not limited in the present disclosure.

If the diameter D1 is excessively small (e.g., less than 160 μm), the solder strip 2 cannot be bonded to the insulating adhesive 11 on the two sides of the positive busbar 12 and/or the negative busbar 13, or the bonding area is excessively small, which results in insufficient stability of the connection between the solder strip 2 and the solar cell 1. If the diameter D1 is excessively large (e.g., greater than 1000 μm), it is not convenient to laminate the photovoltaic module.

Therefore, when the diameter D1 of the circular solder strip ranges from 160 μm to 1000 μm, the stability of the connection between the solder strip 2 and the solar cell 1 can be ensured, without affecting the subsequent lamination step of the photovoltaic module.

The solder strip 2 has small hardness, and the circular solder strip can be deformed into an oval shape by pressing, so as to increase the area of contact with the insulating adhesive 11 and facilitate bonding between the two.

Figure 12:
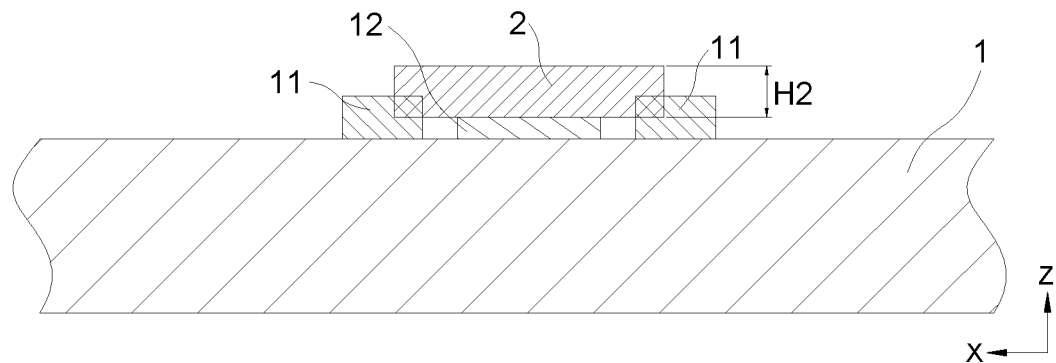
FIG. 12 is a sectional view of FIG. 3 according to some embodiments.

As shown in FIG. 5 and FIG. 12, when the solder strip 2 is the T-shaped solder strip or the rectangular solder strip, a height H2 thereof ranges from 260 μm to 1200 μm, which may be, for example, 260 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1000 μm, 1050 μm, 1100 μm, 1150 μm, or 1200 μm, or other values in the above range, which is not limited in the present disclosure.

If the height H2 is excessively small (e.g., less than 260 μm), the solder strip 2 has insufficient strength is prone to breakage during the manufacturing, which affects the use of the solar cell 1. If the height H2 is excessively large (e.g., greater than 1200 μm), it is not convenient to laminate the photovoltaic module.

Therefore, when the height H2 of the T-shaped solder strip or the rectangular solder strip ranges from 260 μm to 1200 μm, strength of the solder strip 2 can be improved, without affecting the subsequent lamination step of the photovoltaic module.

In addition, when the solder strip 2 is the T-shaped solder strip or the rectangular solder strip, during the placement of the solder strip 2, part of the insulating adhesive 11 may half-wrap the solder strip 2 from two sides of the solder strip 2 along the second direction Y, so as to further improve the strength of the bonding between the solder strip 2 and the insulating adhesive 11, thereby improving the stability of the connection between the solder strip 2 and the solar cell 1.

As shown in FIG. 5, when the solder strip 2 is the T-shaped solder strip, the solder strip 2 includes a main body portion 21 and an abutting portion 22. The main body portion 21 is configured to be bonded to the insulating adhesive 11 along the second direction Y. The abutting portion 22 is configured to abut against the positive busbar 12 and/or the negative busbar 13. The abutting portion 22 is located between the insulating adhesive 11 on two sides, which can increase the bonding area of the solder strip 2 and the insulating adhesive 11, so that the connection between the solder strip 2 and the solar cell 1 is firmer.

It is to be noted that the dimension of the abutting portion 22 in the second direction Y is less than the distance between the insulating adhesive 11 at two positions, so that a certain gap can be maintained between the abutting portion 22 and the insulating adhesive 11 to enable the abutting portion 22 to be smoothly placed at the position between portions applied with the insulating adhesive 11.

The above descriptions are only preferred embodiments of the present disclosure, and are not intended to limit the present disclosure. For those skilled in the art, various modifications and changes may be made to the present disclosure. Any modifications, equivalent replacements, improvements, and the like made within the spirit and the principle of the present disclosure shall fall within the protection scope of the present disclosure.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for manufacturing a photovoltaic module, comprising:
   providing a plurality of solar cells and a solder strip, wherein the solar cells are back contact solar cells;
   applying an insulating adhesive on a rear surface of the solar cells;
   laying the plurality of solar cells in sequence along a first direction;
   placing the solder strip on the solar cells so that, along the first direction, one end of the solder strip abuts against a positive busbar of one of the solar cells, and at least part of the one end of the solder strip is bonded to the insulating adhesive on the solar cells, and the other end of the solder strip abuts against a negative busbar of another one of the solar cells adjacent thereto, and at least part of the other end of the solder strip is bonded to the insulating adhesive on the solar cells;
   curing the insulating adhesive by irradiation with an ultraviolet lamp to fixedly connect the solder strip to the solar cells, so that the plurality of solar cells are connected through the solder strip to form a solar cell string;
   arranging a plurality of formed solar cell strings along a second direction, and connecting two adjacent solar cell strings in series and/or in parallel to form a photovoltaic cell pack, wherein the second direction is perpendicular to the first direction;
   providing a front packaging structure and a back packaging structure; and
   arranging the front packaging structure on a front surface of the photovoltaic cell pack, arranging the back packaging structure on a rear surface of the photovoltaic cell pack, and laminating the front packaging structure, the photovoltaic cell pack, and the back packaging structure to form the photovoltaic module,
   wherein, subsequent to the applying an insulating adhesive on a rear surface of the solar cells and prior to the laying the plurality of solar cells in sequence along a first direction, the method further comprises:
      performing adhesive deviation inspection to the solar cells on which the insulating adhesive is applied; and
      performing appearance inspection to the solar cells, and
   wherein, subsequent to the performing appearance inspection to the solar cells, the method further comprises:
      scribing each of the solar cells into half-cut cells; and
      performing front appearance inspection and back appearance inspection to the half-cut cells.

2. The method according to claim 1, wherein, the applying an insulating adhesive on a rear surface of the solar cells comprises:
   applying, along the second direction, the insulating adhesive on negative fingers on two sides of the positive busbar and/or positive fingers on two sides of the negative busbar.

3. The method according to claim 2, wherein the abutting the solder strip against a positive busbar and bonding at least part of the solder strip to the insulating adhesive on the solar cells comprises:
   bonding, along the second direction, two sides of the solder strip respectively to the insulating adhesive on the negative fingers on the two sides of the positive busbar; and/or
   the abutting the solder strip against a negative busbar and bonding at least part of the solder strip to the insulating adhesive on the solar cells comprises:
   bonding, along the second direction, two sides of the solder strip respectively to the insulating adhesive on the positive fingers on the two sides of the negative busbar.

4. The method according to claim 1, wherein a thickness of the applied insulating adhesive is in a range of 30 μm to 70 μm.

5. The method according to claim 1, wherein a width W1 of the applied insulating adhesive along the first direction is in a range of 200 μm to 600 μm.

6. The method according to claim 1, wherein a length L1 of the applied insulating adhesive along the second direction is in a range of 800 μm to 1200 μm.

7. The method according to claim 1, wherein, in the curing the insulating adhesive by irradiation with an ultraviolet lamp, an irradiation time of the ultraviolet lamp ranges from 0.2 s to 0.8 s.

8. The method according to claim 1, wherein, in the curing the insulating adhesive by irradiation with an ultraviolet lamp, an irradiance of the ultraviolet lamp ranges from 500 m·W/cm$^2$ to 1000 m·W/cm$^2$.

9. The method according to claim 1, wherein, subsequent to the curing the insulating adhesive by irradiation with an ultraviolet lamp, the method further comprises:
   applying a reinforcing adhesive to an exposed surface of the solder strip, so that at least part of the reinforcing adhesive is bonded to the insulating adhesive and/or the rear surface of the solar cells; and
   curing the reinforcing adhesive by irradiation with the ultraviolet lamp.

10. The method according to claim 9, wherein, the applying a reinforcing adhesive to an exposed surface of the solder strip comprises:
    applying, along the first direction, the reinforcing adhesive intermittently on the solder strip.

11. The method according to claim 9, wherein, in the curing the reinforcing adhesive by irradiation with the ultraviolet lamp, an irradiation time of the ultraviolet lamp ranges from 2 s to 6 s.

12. The method according to claim 9, wherein, in the curing the reinforcing adhesive by irradiation with the ultraviolet lamp, an irradiance of the ultraviolet lamp ranges from 1000 m·W/cm$^2$ to 2000 m·W/cm$^2$.

13. The method according to claim 9, wherein a thickness of the applied reinforcing adhesive is in a range of 50 μm to 300 μm.

* * * * *